(12) United States Patent
Decaens

(10) Patent No.: US 8,344,926 B2
(45) Date of Patent: Jan. 1, 2013

(54) ANALOG-TO-DIGITAL CONVERTER ON TWO BITS WITH SUCCESSIVE APPROXIMATIONS

(75) Inventor: Gilbert Decaens, Grenoble (FR)

(73) Assignee: Societe Francaise de Detecteurs Infrarouges-Sofradir, Chatenay Malabry (FR)

( * ) Notice: Subject to any disclaimer, the term of this patent is extended or adjusted under 35 U.S.C. 154(b) by 75 days.

(21) Appl. No.: 12/913,297

(22) Filed: Oct. 27, 2010

(65) Prior Publication Data

US 2011/0102229 A1    May 5, 2011

(30) Foreign Application Priority Data

Nov. 3, 2009   (FR) ...................... 09 05267

(51) Int. Cl.
    $H03M$ $1/38$    (2006.01)
(52) U.S. Cl. ........................ 341/161; 341/118
(58) Field of Classification Search .................. 341/161, 341/118, 120, 172, 156, 155, 163
    See application file for complete search history.

(56) References Cited

U.S. PATENT DOCUMENTS 7,755,521 B1 * 7/2010 Kuramochi et al. .......... 341/118

OTHER PUBLICATIONS

Ogawa, S. et al., "A High Speed, Switched-Capacitor Analog-to-Digital Converter Using Unity-Gain Buffers," *IEICE Transactions on Fundamentals of Electronics, Communications and Computer Sciences*, 1993, pp. 924-930, vol. E76-A, No. 6.
Ginetti, B. et al., "A CMOS 13-b Cyclic RSD A/D Converter," *IEEE Journal of Solid-State Circuits*, 1992, pp. 957-964, vol. 27, No. 7.

* cited by examiner

*Primary Examiner* — Joseph Lauture
(74) *Attorney, Agent, or Firm* — Oliff & Berridge, PLC

(57) ABSTRACT

The analog-to-digital converter comprises a first stage in which a voltage to be converted is applied to the input of a first comparator. The first comparator delivers a first digital result representative of the comparison between the voltage to be converted and the reference voltage on a first digital output. The first digital output is connected to means for calculating a first intermediate voltage. A second comparator compares the first intermediate voltage with the reference voltage and delivers a second digital result on a second digital output terminal. The digital output terminal is connected to second means for calculating a residual voltage according to the voltage to be converted, the first and second voltages and the first and second digital results.

8 Claims, 3 Drawing Sheets

ANALOG-TO-DIGITAL CONVERTER ON TWO BITS WITH SUCCESSIVE APPROXIMATIONS

BACKGROUND OF THE INVENTION

The invention relates to an analog-to-digital converter comprising at least a first stage comprising:
an input terminal on which a voltage to be converted comprised within a first range of voltages defined by first and second voltages is applied,
first means for comparing the voltage to be converted with at least a first voltage representative of division of said first range into at least two equal sub-ranges or three sub-ranges, said first means for comparing delivering a first digital value on at least a first bit representative of said comparison on a first digital output,
first means for calculating delivering a first intermediate voltage according to the voltage to be converted, to the first digital result and to said first and second voltages.

STATE OF THE ART

Conversion of an analog signal into a digital signal is performed in conventional manner by means of analog-to-digital converters. Several types of analog-to-digital converters are known and their uses are defined according to the conversion time, their precision as well as to their manufacturing cost which takes account of the difficulties of fabrication and/or of the surface used on a chip and/or on the consumption. Converters can be divided into different categories, the most widely known being flash converters, pipeline converters, successive approximation converters, ramp converters and Sigma-Delta converters.

Successive approximation converters are looped systems built around a single stage formed by a one-bit converter. Conversion of the voltage to be converted Vin is performed bit by bit at each new iteration, i.e. by means of successive clock cycles, starting from the Most Significant Bit and finishing with the Least Significant Bit. To convert a voltage Vin on n bits, a minimum of n iterations are required. It then becomes obviously apparent that the higher the digital resolution required, the larger the number of conversion bits required and the longer the conversion time.

Operation of such a cyclic converter can be explained in the following manner. Voltage to be converted Vin is comprised within a range of predefined voltages bounded by first and second voltages. This range of voltages is divided into two equal sub-ranges, a first sub-range comprising the lowest voltages and the second sub-range comprising the highest voltages. Bounding of these sub-ranges is performed by means of a reference voltage Vref. It is then sought to know in which sub-range voltage Vin is situated. Depending on whether the voltage to be converted is situated in the sub-range of the initial range containing the lowest values or in the sub-range containing the highest values, a '0' or a '1' is respectively assigned to the highest bit representative of the comparison with reference voltage Vref. The sub-range comprising voltage Vin is then further divided into two equal parts and it is again sought to know which part the voltage to be converted belongs to, and a second bit equal to 1 or 0 is defined from this new comparison and so on according to the required resolution.

Two approaches can be envisaged to perform this conversion. In a first approach, depending on whether the computed bit is equal to 1 or 0, the reference voltage can be subtracted from a voltage representative of the voltage to be converted. One of the first or second voltages is replaced by reference voltage Vref so as to represent the new accessible range at the next iteration, i.e. sub-range of the previous iteration which comprised the voltage to be converted.

In a second approach which is equivalent from the conversion result standpoint, the voltages defining the accessible ranges are fixed and it is voltage to be converted Vin (which is multiplied by two) from which the reference voltage is subtracted or not to define the intermediate voltage.

Depending on whether the voltage to be converted is situated in one or the other of the sub-ranges, an intermediate voltage Vi representative of the voltage to be converted is computed from the voltage to be converted and the reference voltage. This intermediate voltage Vi is the voltage to be converted at the next iteration or the next block, i.e. the voltage used for determining the next bit.

A typical example of a successive approximation converter is a converter of cyclic or algorithmic type illustrated in FIG. 1.

In a cyclic converter, voltage to be converted Vin is successively compared with a binary fraction of a reference voltage Vref which is more and more precise with each successive clock cycle. Voltage to be converted Vin and all the intermediate voltages Vi are compared with the comparison reference voltage Vref.

Voltage to be converted Vin is applied to an input of a first sample and hold stage 1. The output terminal of first sample and hold stage 1 is connected to a first input of a first comparator 2 with digital output on one bit. Reference voltage Vref is applied on the second input of digital output comparator 2. The output terminal of comparator 2 then delivers a bit Bi representative of the comparison between the voltages applied on its two input terminals. The output terminal of comparator 2 is connected to a register which stores the delivered bit Bi. The output terminal of the comparator is also connected to an input terminal of means for calculating 3 a first intermediate voltage V1, such as a computer of first intermediate voltage V1. First intermediate voltage V1 is representative of voltage $2Vin-(Va+Vb)/2+Bi.(Va-Vb)/2+Bi.(Vb-Va)/2$ according to the approach used for management of the voltages when the iterations are made, as described in the foregoing. According to the value of bit Bi, means for calculating 3 deliver a voltage V1 representative of $2Vin-Vb$ or $2Vin-Va$ on output which corresponds to the residue of analog type that is applied to the input of the next converter stage used to convert voltage Vin on a second bit. The output terminal of means for calculating 3 can then be connected to the input of this same stage (FIG. 1) or to the input of the next stage (typically in a pipeline architecture that is not represented).

By means of this architecture, voltage to be converted Vin is thus applied to the input of first sample and hold stage 1 which stores the latter in memory throughout the iteration. On output from first sample and hold stage 1, voltage Vin is compared with reference voltage Vref by first digital comparator 2 which delivers a bit Bi representative of the comparison on output. By convention, if voltage Vin is greater than voltage Vref, first comparator 2 sends a '1', in the opposite case it sends a '0'. This representative bit Bi is stored in a register (not represented) and is also applied to means for calculating 3 first intermediate voltage V1. At each iteration, the same converter therefore determines a bit representative of voltage to be converted Vin although this voltage is not really applied to the converter throughout the conversion. At the second iteration and the following iterations, conversion is in fact performed on first intermediate voltage V1 which is representative of the voltage to be converted and of the following intermediate voltages representative of the previous intermediate voltages.

An example embodiment is described in the publication by Ogawa et al. "A High Speed Switched-Capacitor Analog-to-Digital Converter Using Unity-Gain Buffers" IEICE transactions on Fundamentals of Electronics, Communications and Computer Sciences, Engineering Sciences Society Vol/76A, n°6, 1993, pp 924-930. In this embodiment, two comparators are connected in series and are arranged in such a way as to use the two phases of a clock signal to successively generate the two bits from the voltage to be converted and from the intermediate voltage.

In general manner, successive approximation converters are limited to resolution on 10 bits as the imprecisions on the different voltages degrade the precision of the final digital result and conversion on more than 10 bits does not provide any more precision than conversion on 16 bits on account to of the successive errors introduced at each iteration.

OBJECT OF THE INVENTION

The object of the invention is to produce a converter that provides a greater precision in digital conversion of an analog voltage on n bits, conversion times lower than or equal to those corresponding to a cyclic converter on n bits while at the same time preserving a low consumption and a small converter surface to be used in embedded systems.

The converter according to the invention is characterized in that said first intermediate voltage being comprised within a second range of voltages representative of the sub-range in which the voltage to be converted is comprised, said first stage comprises:

second means for comparing the first intermediate voltage with at least a second voltage representative of division of said second range into at least two equal sub-ranges, said second digital means for comparing delivering, on a second digital output, a second digital value on at least a second bit representative of said comparison, second means for calculating a residual voltage delivering said residual voltage on an analog output of the first stage according to the voltage to be converted, to the first and second digital results and to said first and second voltages, the residual voltage being applied to the input of the first stage or to an input of a subsequent stage of the same type as the first stage.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
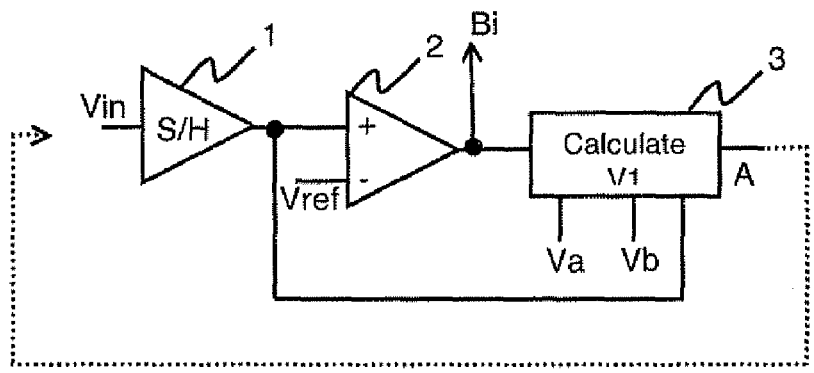
FIG. 1 represents a cyclic converter on one bit according to the prior art in schematic manner.
Figure 2:
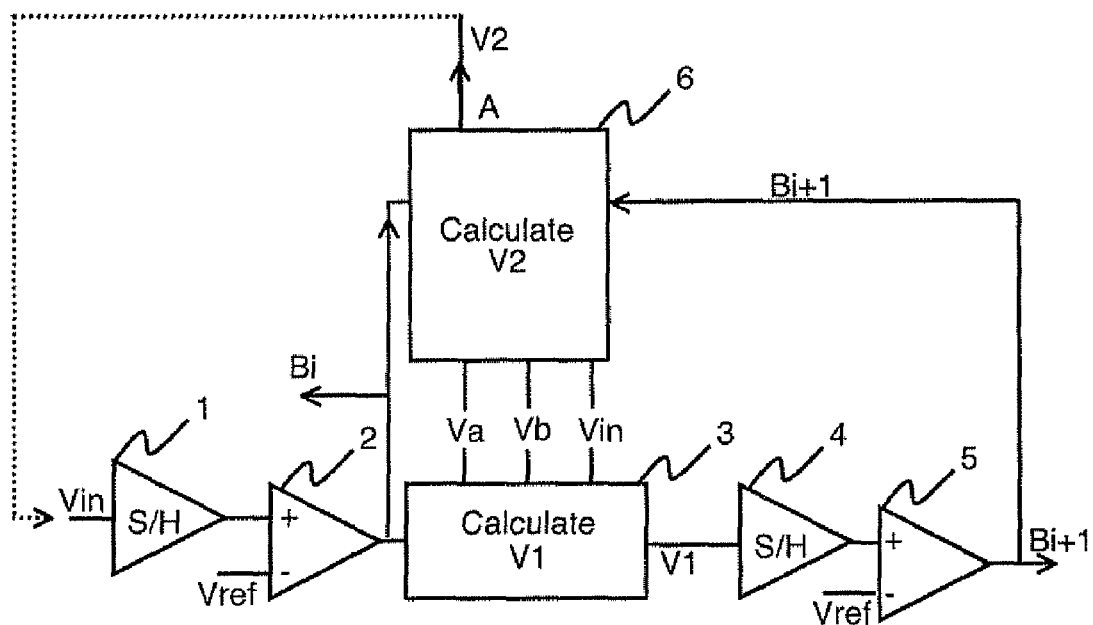
FIG. 2 represents a successive approximation converter on two bits according to the invention in schematic manner.

As illustrated in FIG. 2, in a first particular embodiment, the analog-to-digital converter on at least two bits is composed of at least a first stage comprising an analog-to-digital converter on two bits $B_i$ and $B_{i+1}$. This first stage comprises an input terminal on which the voltage to be converted Vin is applied. The first stage also comprises two digital output terminals associated with bits $B_i$ and $B_{i+1}$ and an analog output terminal A which can be associated with another stage or looped back onto the input of this first stage. In general manner, the converter is composed of at least a first stage whether it be for integration in a pipeline or a cyclic architecture. The analog-to-digital converter acts as a successive approximation analog-to-digital converter.

In a pipeline architecture, analog output terminal A of the stage represented in FIG. 2 is connected to an input of a converter of the same type forming the next stage. In this way, the first stage converts the first two bits of voltage to be converted Vin and supplies to the next stage an analog residue, i.e. a residual voltage V2, that is converted to form the next two bits. In this example, voltage Vin is therefore converted on at least four bits.

In an architecture called cyclic, there is only one analog-to-digital converter stage, the first stage. Analog output terminal A is then reconnected to the input terminal of the first and only stage. In this way, at each iteration, the converter converts two bits of voltage to be converted Vin. At the first iteration, the converter delivers the first and second bits from voltage to be converted Vin and at the next iteration, the converter delivers the third and fourth bits from the analog residue, voltage V2, delivered at the second clock cycle or the following iteration. Reconnection between analog output terminal A and the input terminal is performed in conventional manner.

In general manner, an analog-to-digital converter on 2n bits can be obtained by adding n successive two-bit converter stages (pipeline architecture) or by performing at least n conversion loops on two bits on the first stage (cyclic converter).

In conventional manner, voltage to be converted Vin is comprised between first voltage Va and second voltage Vb which represent the limits of the range accessible to voltage Vin. Second voltage Vb is higher than first voltage Va. According to the different possible embodiments, the accessible range is divided into at least two portions which are bounded by at least a first reference voltage. If the accessible range comprises an even number of sub-ranges, the range is divided into equal sub-ranges. If the accessible range comprises an odd number of sub-ranges, the span of the different sub-ranges can be variable. Advantageously, the accessible range is divided into two or three sub-ranges. In the particular case where the range is divided into two equal portions, bounding is performed by means of a single to reference voltage Vref which is equal to (Va+Vb)/2.

For example purposes, if the first and second voltages are equal in absolute values but of opposite signs (Va=−Vb), the reference voltage is then zero (Vref=0). If the first and second voltages are respectively equal to 0 and V (Va=0, Vb=V), reference voltage Vref is then equal to V/2. The reference voltage is then situated at the equipotential of voltages Va and Vb.

It is also possible to divide the range into more than two portions, typically three portions, to prevent errors of the means for comparing. In this embodiment illustrated in FIG. 5, voltage to be converted Vin is compared with several reference voltages, for example first and second reference voltages Vref⁻ and Vref⁺. An example of implementation of this comparison method is described for example by Ginetti et al 'A CMOS 13-b Cyclic RSD A/D Converter' IEEE Journal of Solid-State Circuits Vol. 27, N°7, July 1992.

In conventional manner, the converter can modify voltage to be converted Vin between two iterations or it can modify the voltages bounding the accessible range and reference voltage Vref. In this way, in one embodiment, voltage to be converted Vin is multiplied for example by a factor two or by a factor four, whereas in another embodiment the accessible range is divided by two or by four by modifying the limit voltages.

As specified in the foregoing, according to the embodiment used, first and second voltages Va and Vb can be identical between the different stages and within a stage, but these voltages can also vary between the different stages and within the stages so as to represent the voltage ranges accessible to the voltage to be converted or to its representative voltage which will be converted. First and second voltages represent upper and lower limit voltages of the conversion range comprising the voltage to be converted.

Figure 3:
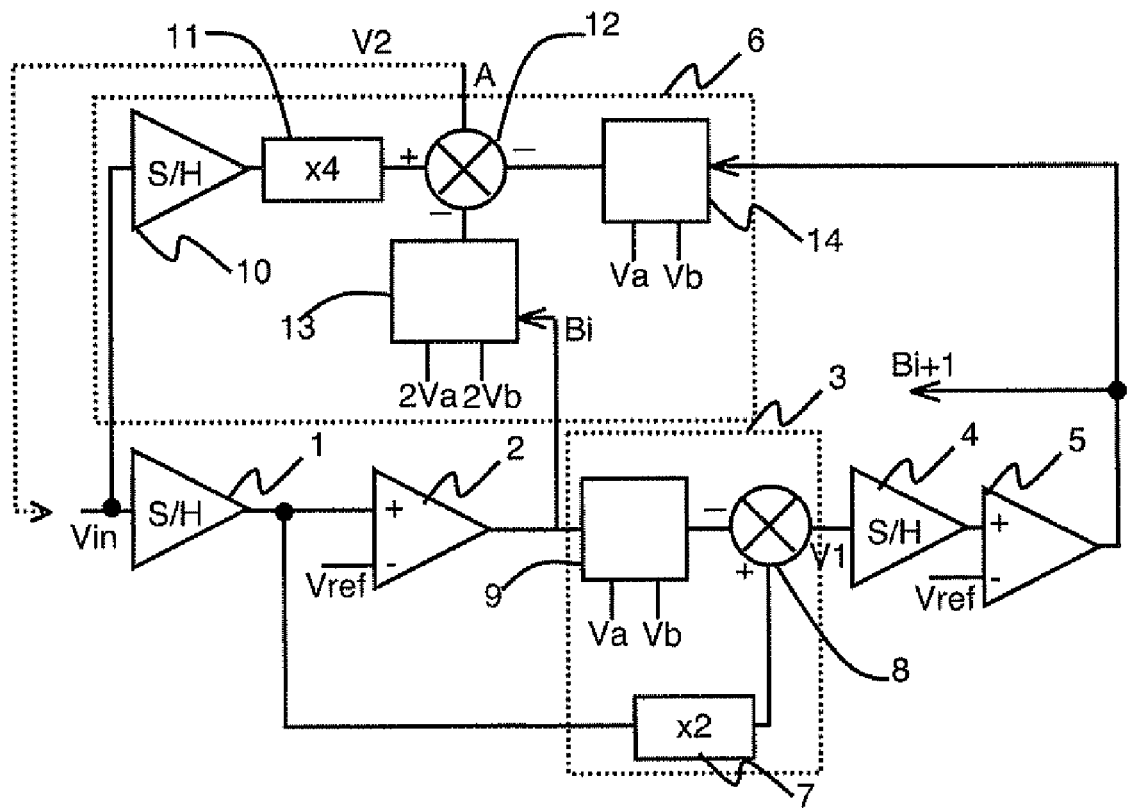
FIG. 3 represents a particular embodiment corresponding to the converter illustrated in FIG. 2.
Figure 4:
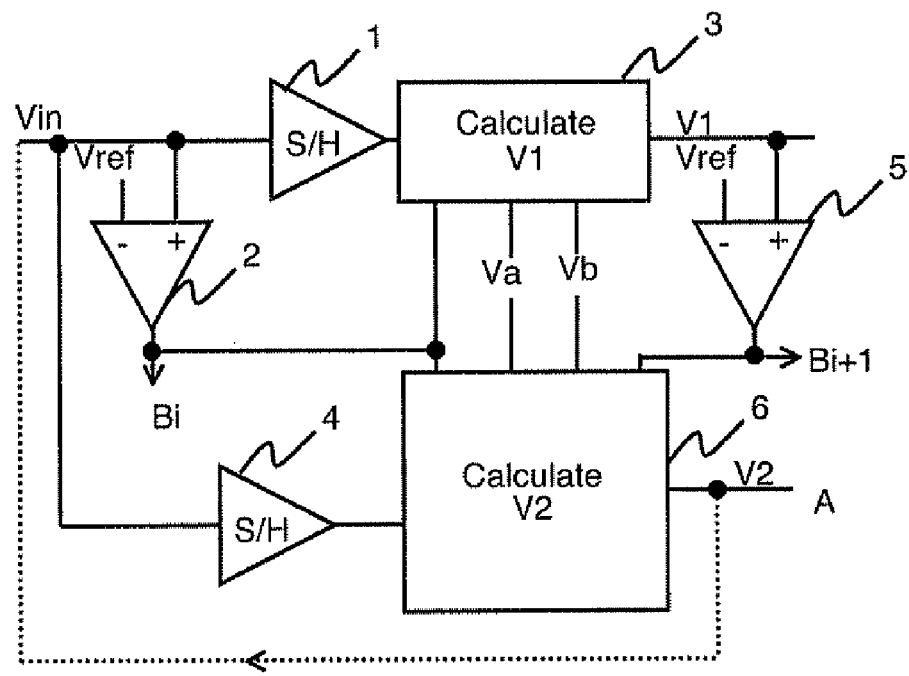
FIG. 4 represents an alternative embodiment of a successive approximation converter on two bits according to the invention in schematic manner.

As illustrated in FIGS. 2, 3 and 4, the first stage of the converter in general manner comprises first digital output means for comparing 2, for example a first digital output comparator, for comparing voltage to be converted Vin with at least the first reference voltage representative of division of the accessible voltage range into at least two sub-ranges. This first digital output comparator 2 delivers a first digital value on at least a first bit Bi on the first digital output terminal of the first stage, which value is representative of the comparison between voltage to be converted Vin and the reference voltage or voltages. For example, if the range is divided into two sub-ranges, first comparator 2 delivers a first bit and if the range is divided into three sub-ranges, the first means for comparing deliver two bits.

The first stage also comprises means for calculating 3, such as a first calculator, delivering a first intermediate voltage V1. This first intermediate voltage V1 is a function of voltage to be converted Vin, of the value of the first digital result (at least first bit Bi) and of first voltage Va and second voltage Vb. In this way, means for calculating 3 are connected directly to voltage Vin and deliver on output intermediate voltage V1 originating from voltage Vin of first and second voltages Va and Vb and from the value of first bit Bi. Means for calculating 3 are direct calculating means as the voltage delivered on output originates directly from the value of voltage to be converted Vin, i.e. without any alteration. The sample and hold stage performs sampling of voltage Vin thereby enabling a constant voltage to be delivered to the input of the means for calculating.

By convention, voltage to be converted Vin is situated in a first voltage range which is bounded by the first and second voltages and first intermediate voltage V1 is situated in a second voltage range. This second voltage range is representative of the sub-range of the first voltage range that contained voltage to be converted Vin. Each intermediate voltage is thus situated within a dedicated range.

Second means for comparing 5 with a digital output on one bit are also integrated in the first stage. These second digital means for comparing 5, such as a second digital output comparator, compare first intermediate voltage V1 with at least a second voltage representative of division of the second range into at least two sub-ranges. As for the first range, the second range can be divided by an even or odd number of sub-ranges. The second range can be divided by an even number of equal sub-ranges or by an odd number of sub-ranges having a variable span. In the case of a range divided into two sub-ranges bounded by the reference voltage, second digital means for comparing 5 compare first intermediate voltage V1 with the reference voltage.

Second digital output comparator 5 delivers a second digital output, at least a second bit $B_{i+1}$, on the second digital output terminal of the first stage. This second digital output is representative of the comparison between first intermediate voltage V1 and the reference voltage or voltages.

In the case of division of each range into two sub-ranges, reference voltage Vref which is compared with the intermediate voltage can be identical to or different in value from the voltage that was used as reference for comparison of voltage to be converted Vin. The value of the reference voltage between these two comparison step depends on the management mode as explained in the foregoing. The same is the case for the multiple reference voltages used by each comparator when the range is divided into more than two sub-ranges.

Second means 6 for calculating a residual voltage, such as a second calculator, delivers residual voltage V2 on the analog output of the first stage. Residual voltage V2 is a function of voltage to be converted Vin, of the values of the first and second digital results and of first and second voltages Va and Vb. Second means 6 for calculating are also direct calculating means as the value of the residual voltage originates directly from voltage to be converted Vin, from the values of first and second voltages Va and Vb and from the values of the first and second bits. Residual voltage V2 is obtained directly from voltage Vin and not from intermediate voltage V1. Although the intermediate voltage originates from voltage Vin, voltage Vin is modified and therefore deteriorated to obtain the intermediate voltage. Residual voltage V2 obtained from second means 6 for calculating is therefore less sensitive to conversion errors. Voltage to be converted Vin is applied directly to the input of second means 6 for calculating, and the analog output of the second means for calculating is thereby reapplied to its input or to the input of the next stage. In the case of a cyclic architecture, the analog output of second means 6 for calculating is applied to the input of the same second means 6 for calculating.

In the embodiments illustrated in FIGS. 2 to 5, voltage to be converted Vin is applied directly to the input of means for calculating 3 and 6, via a sample and hold stage or not. This enables the same voltage to be applied to the input of the different means for calculating thereby limiting successive conversion errors. The analog output of first means 3 for calculating is not used for calculating another voltage. This output is only used by second means for comparing 5 to provide the second bit.

The first stage of the analog-to-digital converter can be divided into a first approximation stage and a second approximation stage. The first approximation stage produces the first digital value representative of at least one most significant bit of the digital output value, and the first intermediate analog voltage from the input voltage, the first digital value, the lower limit voltage and the upper limit voltage connected to the input terminal. The first approximation stage is connected to the input terminal. The first approximation stage comprises the first comparator 2 and the first calculator 3. The second approximation stage comprises the second comparator 5 and the second calculator 6. The second approximation stage is connected to the input terminal.

In particular embodiments which will be described in the following, the first stage can comprise additional elements to enable transfer of the different data in organized manner in time. To do this, the first stage will for example comprise sample and hold units.

In the first embodiment illustrated in FIG. 2, the first stage of the analog-to-digital converter comprises a first sample and hold stage 1 connected to the input terminal of the first stage. Voltage to be converted Vin is therefore applied to the input of first sample and hold stage 1. First sample and hold stage 1 comprises a control input, not represented, to define at what time the voltage imposed on the input of first sample and hold stage 1 is to be sampled. After sampling, the measured voltage is then delivered on the output terminal of first sample and hold stage 1 until a new control signal is applied to the control terminal. In advantageous manner, the measured voltage is delivered throughout the first iteration phase. The voltage delivered by the output of first sample and hold stage 1 is equal to voltage to be converted Vin or very close, the sample and hold unit not being perfect. The quality of the final result of the converter depends in non-negligible manner on the quality of the sample and hold units used. To preserve a high conversion quality, this architecture uses a small number of sample and hold units compared with the digital result obtained with one-bit converters of the prior art.

The output terminal of first sample and hold stage 1 is connected to a first input terminal of first means for comparing 2 with digital output on one bit which is here constituted by a first comparator having a digital output on one bit.

Reference voltage Vref is applied to the second input terminal of first comparator 2 which then compares reference voltage Vref with voltage to be converted Vin. According to the result of the comparison between the voltages at its terminals, first comparator 2 delivers a first digital result, for example a first bit Bi which can be equal to 1 or to 0. By convention, if the range is divided into two sub-ranges, bit is equal to 1 if the voltage is higher than the reference voltage and to 0 in the other cases. First bit Bi is equal to 0 or 1 by convention, but in reality the value 1 represents the value of the comparator power supply. This first bit Bi corresponds to the most significant bit of the digital conversion. This first bit is delivered to the outside via the first digital output terminal of the first stage.

The output terminal of first digital output comparator 2 is connected to a register (not represented) which stores the digital result, typically of bit Bi (the bit only being able to be equal to '0' or '1'). The output terminal of first comparator 2 is also connected to the input of means 3 for calculating first intermediate voltage V1.

Means 3 for calculating first intermediate voltage V1 therefore comprise a digital input terminal on which first bit Bi is applied. They also comprise terminals on which voltages respectively representative of voltage to be converted Vin, of first voltage Va and of second voltage Vb are applied. Means 3 for calculating first intermediate voltage V1 also comprise an analog output terminal which delivers first intermediate voltage V1.

First intermediate voltage V1 is therefore a function of voltage to be converted Vin, of first voltage Va and second voltage Vb and of the value of first bit Bi. First intermediate voltage V1 is equal to or representative of the voltage $2Vin-(Va+Vb)/2+Bi.(Va-Vb)/2+\overline{Bi}.(Vb-Va)/2$ in which $\overline{Bi}$ is equal to $1-Bi$. The first intermediate voltage can also be written in the following form $V1=2Vin-Bi.Vb-\overline{Bi}.Va$ or a voltage representative of this formula.

According to a management mode of the voltages chosen for the converter, voltage V1 can for example be equal to $Vin-(Va+Vb)/4+Bi.(Va-Vb)/4-\overline{Bi}.(Vb-Va)/4$. However, this management mode is less used as it is more difficult to implement. Only the management mode described in the foregoing is therefore used in the rest of the description for the sake of clarity. In this embodiment, voltage to be converted Vin and the intermediate voltages are all comprised within the same voltage range.

First intermediate voltage V1 is applied to the input of a second sample and hold stage 4 which is preferably achieved in similar manner to first sample and hold stage 1. Voltage V1 is therefore measured at a predetermined time on its input terminal and is applied on the output terminal of second sample and hold stage 4. The output terminal of second sample and hold stage 4 is connected to a first input of a second digital output comparator 5 on one bit. Reference voltage Vref is applied to a second input of second comparator 5. Second comparator 5 then compares reference voltage Vref with first intermediate voltage V1 and delivers second conversion bit $B_{i+1}$ on output, on a second digital output of the converter. The value of second bit $B_{i+1}$ is equal to 0 or 1 according to the result of the comparison here between reference voltage Vref and first intermediate voltage V1.

In this first stage, the converter also comprises means 6 for calculating a residual voltage V2, such as a second calculator. This residual voltage V2 which can also be assimilated to a second intermediate voltage is a function of voltages representative, advantageously of multiples, of first Va and second Vb voltages, of voltage to be converted Vin and of first Bi and second $B_{i+1}$ bits. Second calculator 6 delivers residual voltage V2 on analog output terminal A of the first stage, which voltage is equal to or representative of the voltage $4Vin-(Va+Vb)+Bi.(Va-Vb)+\overline{Bi}.(Vb-Va)-(Va+Vb)/2+B_{i+}.(Va-Vb)/2+\overline{B}_{i+1}(Vb-Va)/2$ with equal to $1-B_{i+1}$. Residual voltage V2 can also be written in the form $V2=4Vin-2\overline{Bi}.Va-2Bi.Vb-B_{i+1}.Va$ with $\overline{B}_{i+1}1$ equal to $1-B_{1+1}$.

As illustrated in FIG. 3, in a particular embodiment of the more general embodiment illustrated in FIG. 2, the analog-to-digital converter stage comprises an input terminal on which voltage Vin is applied, two digital output terminals and an analog output terminal A. This embodiment corresponds to a voltage management mode in which the voltages defining the limits of the accessible voltage range are fixed and the voltage to be converted Vin varies progressively during its conversion into digital data, via its successive intermediate voltages.

The input terminal of the converter is formed by the input of first sample and hold stage 1. The output terminal of first sample and hold stage 1 is connected to a first input terminal of first comparator 2. The second input terminal of first comparator 2 is connected to reference voltage Vref. The output terminal of first sample and hold stage 1 is also connected to an input terminal of a multiplier by two (×2) circuit 7 the output terminal whereof is connected to a first input terminal of a first summing circuit 8. The second input terminal of first summing circuit 8 is connected to an output terminal of a first digital-to-analog converter 9 an input terminal whereof is connected to the output terminal of first comparator 2. First digital-to-analog converter 9 comprises references terminals on which voltages representative of first voltage Va and second voltage Vb are respectively applied. According to the value of first bit Bi applied to first digital-to-analog converter 9, the latter delivers the opposite of first voltage −Va or the opposite of second voltage −Vb on output. Thus, according to the value of first bit Bi, the voltage on output of summing circuit 8 is equal to first intermediate voltage V1, here $2*Vin-BiVb-\overline{Bi}Va$.

In the even more particular embodiment of FIG. 3, the summing circuit is a subtracting circuit. In this particular case, the output terminal of digital-to-analog converter 9 delivers first or second voltages Va or Vb and is connected to an input terminal of minus type. The output terminal of multiplier circuit 7 is connected to an input terminal of plus type.

The output terminal of first summing circuit 8 is connected to the input terminal of second sample and hold stage 4 the output terminal whereof is connected to the first input terminal, for example the plus terminal, of second digital output comparator 5. The second input terminal of second comparator 5, for example the minus terminal, is connected to reference voltage Vref. As before, second comparator 5 delivers a second bit $B_{i+1}$ representative of the comparison between reference voltage Vref and first intermediate voltage V1 on the second digital output of the converter.

Voltage to be converted Vin is also applied to an input terminal of a third sample and hold stage 10 the output terminal whereof is connected to the input terminal of a multiplier by four circuit 11. Third sample and hold stage 10 and multiplier by four (×4) circuit 11 are thereby connected in series between the input terminal of first sample and hold stage 1 and a first input terminal of second summing circuit 12. The output terminal of multiplier by four circuit 11 is connected to a first input terminal of second summing circuit 12. The output terminal of first comparator 2 is connected to an input of a second digital-to-analog converter 13 and the output terminal of second comparator 5 is connected to the control terminal of a third digital-to-analog converter 14. The output terminals of second 13 and third 14 digital-to-analog converters are respectively connected to second and third input terminals of second summing circuit 12. The output terminal of second summing circuit 12 corresponds to analog output terminal A of the converter. Second 13 and third 14 digital-analog converters are advantageously made in one and the same electronic unit.

This analog output terminal A can, as in FIG. 3, be connected to the input of sample and hold stage 1 which enables the converter to be used again to determine the next two bits of voltage Vin. In conventional manner in calculator 6, the multiplication by four operation and the subtraction operation are performed in one and the same electronic unit.

Voltages representative of first voltage Va and second voltage Vb are applied to second digital-to-analog converter 13, these representative voltages respectively being able to be twice the first voltage 2Va and second voltage 2Vb. First bit Bi being applied to second digital-to-analog converter 13, the analog voltage delivered on output is a function of the value of this first bit and of voltages representative of voltages Va and Vb. First voltage Va and second voltage Vb or voltages representative of the latter, advantageously multiples, can be applied to third digital-to-analog converter 14. In this way, on the analog output of the converter, second summing circuit 12 delivers the residual voltage which is a function of first voltage Va and second voltage Vb and of the values of the first and second bit and of voltage to be converted Vin.

Operation of the analog-to-digital converter can be explained in the following manner for division of the voltage range into two sub-ranges. Voltage to be converted Vin is applied to the input of first sample and hold stage 1 which will measure voltage Vin and supply an equivalent voltage during a first period. First comparator 2 then compares the voltages on its input terminals, i.e. it compares voltage Vin with reference voltage Vref, and delivers a first bit Bi (0 or 1) representative of this comparison on output. If voltage to be converted Vin is higher than voltage Vref, first comparator 2 sends a '1' on output, in the opposite case it sends a '0' on output. This binary signal is applied to the input of first digital-to-analog converter 9 which then applies the opposite of first voltage Va or second voltage Vb on its output terminal.

During this first period, the output terminal of first digital-to-analog converter 9 and the output terminal of multiplier by two circuit 7 both being connected to the input terminals of summing circuit 8, summing circuit 8 delivers the difference between twice the voltage Vin and the absolute value of first or second voltage ($2*Vin-BiVb-\overline{Bi}Va$) on output. In this way, during the first period, voltage to be converted Vin is sampled and then compared to obtain the first bit and first intermediate voltage V1 is calculated and applied to the input of second sample and hold stage.

This voltage is sampled and held by second sample and hold stage 4 so that, in a second period, the voltage supplied by first summing circuit 8 is converted into a second bit $B_{i+1}$ by second comparator 5. During this second period, an analog voltage representative of the two bits (Bi and $B_{i+1}$) is subtracted from four times the voltage to be converted (4Vin) and this difference corresponds to residual voltage V2, i.e. to the residue of analog type which is applied on output A to another converter (or another iteration) for determination of other bits if this is necessary.

Thus, during the first period, the most significant bit Bi is determined by first comparator 2 for voltage Vin and during the next period, the next bit $B_{i+1}$ is determined by means of second comparator 5. This operating mode is specific to the converters illustrated in FIGS. 2 and 3, but it is easily transposable to the other embodiments hereunder.

In an alternative embodiment illustrated in FIG. 4, the converter is associated with a circuit which delivers thereto a voltage to be converted Vin which has already been sampled at the level of the circuit.

Voltage to be converted Vin is applied to an input of a first sample and hold stage 1 which is itself connected to a first calculator 3 of first intermediate voltage V1 via its output terminal. Voltage to be converted Vin is also connected to an input of a second sample and hold stage 4 which is itself connected to a second calculator 6 of second intermediate voltage V2 via its output terminal. Voltage to be converted Vin is also applied to a first input, here the plus input, of a first comparator 2 a reference voltage Vref whereof is applied to a second input, here the minus input. An output terminal of first comparator 2 is connected to a digital input terminal of calculators 3 and 6. In this way, voltage to be converted Vin is compared with reference voltage Vref by means of first comparator 2 and the result of this comparison, a bit Bi, is applied to calculators 3 and 6.

Calculators 3 and 6 also comprise input terminals on which first voltage Va and second voltage Vb or voltages representative of the latter, typically multiples of the latter, are applied. Calculator 3 of first intermediate voltage V1 delivers intermediate voltage V1 on an output terminal. This intermediate voltage V1 is applied on a first input terminal, here the plus terminal, of a second comparator 5 a reference voltage Vref whereof is applied to a second input, here the minus input. In this way, intermediate voltage V1 is compared with reference voltage Vref by means of second comparator 5 and the result of this comparison, another bit $B_{i+1}$, is applied to calculator 6 of residual voltage V2. Depending on the integration architecture in which the converter is used, voltage V2 can be applied to the next stage or be applied again to the converter input, i.e. to first and second sample and hold stages 1 and 4 and to first comparator 2. This architecture is more advantageous as voltage V2 is obtained in a single step instead of in two steps according to the prior art. This embodiment is also faster as comparison can be performed during the sample and hold step, which is not the case in the prior art. The use of multiplication of the voltage to be converted Vin by four in the converter makes it possible to achieve a higher resolution and a more precise residue, used in the next iteration or stage.

In an advantageous embodiment of this analog-to-digital converter on two bits, conversion is performed at each iteration and is broken down into a plurality of elementary phases which can each comprise one or more clock cycles. Indeed, as an example, depending on the quantity of sample and hold devices integrated in the converter and their arrangement in the circuit, the number of clock cycles can vary to obtain a similar result to $4V_{in}-(V_a+V_b)+B_i.(V_a-V_b)+\overline{B_i}.(V_b-V_a)-(V_a+V_b)/2+B_{i+1}.(V_a-V_b)/2+\overline{B_{i+1}}(V_b-V_a)/2$.

For example purposes, a possible operation of the embodiment illustrated in FIG. 4 is given for an iteration. In a first phase, voltage to be converted Vin is applied to the input of the converter. In this first period, at a time t1, first sample and hold stage 1 is commanded to perform sampling and holding of voltage to be converted Vin which is applied to its input. First sample and hold stage 1 then delivers a voltage representative of voltage Vin, preferably a voltage equal to the voltage to be converted, on an output terminal.

During the first period, at time t1 or at another time, voltage to be converted Vin is compared with reference voltage Vref, and depending on whether voltage to be converted Vin is higher or lower than reference voltage Vref, first comparator 2 delivers a first bit Bi respectively equal to 1 or 0. Comparison with the reference voltage is advantageously performed at the end of the period, just before t1, when the signal is well established on input of the sample and hold stage.

In a second period, calculator 3 performs calculation of first intermediate voltage V1. Calculation is performed according to two parameters determined during the first period, first bit Bi and the sampled voltage representative of voltage Vin.

In a third period, first intermediate voltage V1 is compared with reference voltage Vref. Depending on whether first intermediate voltage V1 is higher or lower than reference voltage Vref, second comparator 5 delivers a second bit $B_{i+1}$ respectively equal to 1 or 0.

Voltage to be converted Vin is also sampled and held by second sample and hold stage 4 so as to deliver a constant voltage to calculator 6 of residual voltage V2. This sampling and holding can be performed independently during the first, second and third periods. However, in advantageous manner, sampling and holding by the second sample and hold stage are performed during the first period at the same time as sampling by first sample and hold stage 1. In this way, the same voltage representative of voltage to be converted Vin is applied to calculators 3 and 6.

In a fourth period, calculator 6 calculates residual voltage V2, according to first bit Bi, determined during the first period, to second bit $B_{i+1}$ determined during the third period, and to the voltage applied by second sample and hold stage 4. First intermediate voltage V1 is not used by calculator 6 in order not to introduce the errors linked to calculator 3 in calculation of residual voltage V2.

In general manner, the converter in a first step performs extraction of first bit Bi and then in a second step performs extraction of second bit $B_{i+1}$ by means of voltage Vin, first voltage Va and second voltage Vb and the first bit. In this way, the converter does not enable the conversion speed to be increased, but does enable the conversion precision to be increased and the power consumption to be reduced.

Figure 5:
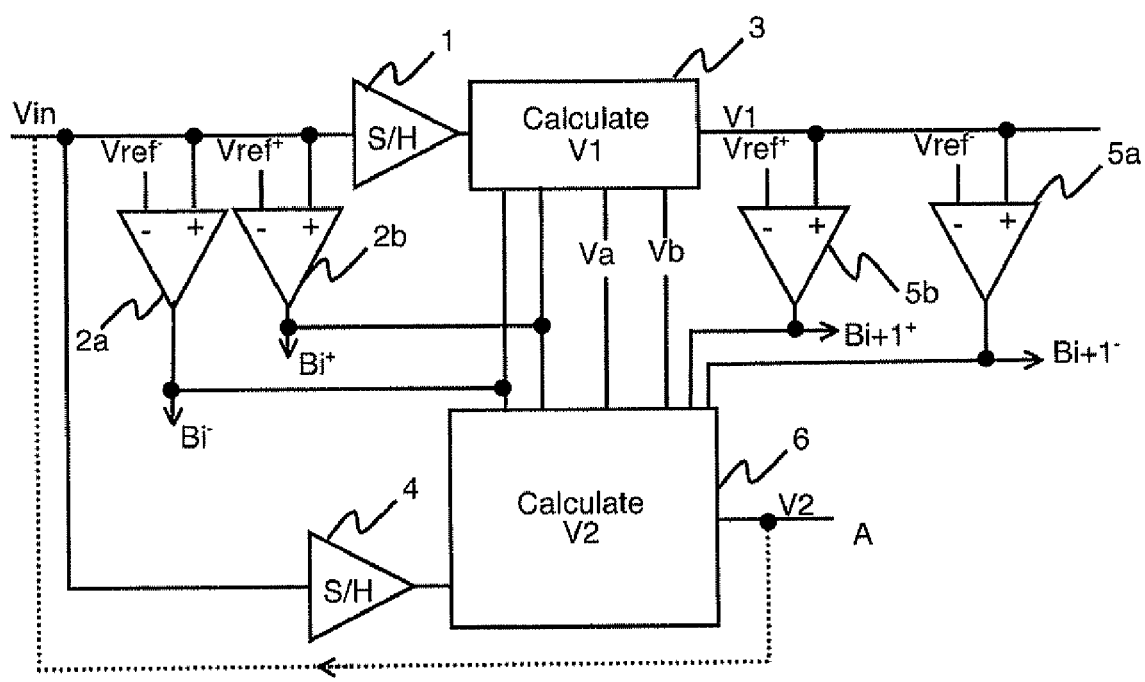
FIG. 5 represents an alternative embodiment of a successive approximation converter according to the invention in schematic manner.

In a privileged embodiment illustrated in FIG. 5, means for comparing 2 and 5 comprise a Redundant Signed Digit (RSD) architecture which means that operation of the converter is more robust. By means of this particular architecture, the imprecisions linked with the comparators present in means for comparing 2 and 5 are reduced. The range accessible to the voltage to be converted Vin and to the intermediate voltages is divided into an odd number of sub-ranges, for example three sub-ranges. For a breakdown into three sub-ranges, means for comparing 2 and 5 each comprise two elementary comparators 2a, 2b and 5a, 5b. The means for comparing then deliver a digital result on two bits. However, as these two bits cannot take all the possible values, this digital signal has to be reworked to turn it into a real binary signal. The first elementary comparators 2a and 5a of means for comparing 2 and 5 have a first input terminal connected to a first reference voltage Vref and have a second input terminal respectively connected to the voltage to be converted Vin and to the first intermediate voltage. In this way, first elementary comparators 2a and 5a perform comparison of the voltage to be converted or of first intermediate voltage V1 with the first reference voltage. A similar connection and operation are made for second elementary comparators 2b and 5b of means for comparing 2 and 5, Second elementary comparators 2b and 5b perform comparison of voltage to be converted Vin or of first intermediate voltage V1 with second reference voltage $Vref^+$.

In this particular embodiment, the range accessible to the voltage to be converted Vin is divided into three sub-ranges by means of first and second reference voltages $Vref^-$ and $Vref^+$. The first and second reference voltages are voltages that are situated in the range defined by first voltage Va and second voltage Vb. The accessible voltage range being divided into three sub-ranges that can be equal or not, means for comparing 2 and 5 each deliver two elementary bits $Bi^-$, $Bi^+$ and $B_{i+1}^-$, $B_{i+1}^+$ on output. The values of the different bits represent the positioning of voltage to be converted Vin or of first intermediate voltage V1 in the accessible range. All the combinations between bits $Bi^-$ and $Bi^+$ or between bits $B_{i+1}^-$ and $B_{i+1}^+$ are therefore not possible. In this particular embodiment, the converter comprises transcription means of the elementary bits obtained at the different iterations into a binary format representative of voltage to be converted Vin. Production of a converter according to an RSD architecture is described for example by Ginetti et al in the publication referred to above.

In this particular architecture, means for calculating 3 and 6 take account of the presence of the two elementary bits delivered by means for comparing 2 and 5. By defining $(V_a+V_b)/2 \leq Vref^+ < (V_a+V_b)/2+(V_b-V_a)/4$ and $(V_a+V_b)/2+(V_a-V_b)/4 < Vref^- \leq (V_a+V_b)/2$, the voltage delivered by first means for calculating 3 can be defined as being equal to $2V_{in}-(\overline{Bi^-\text{ AND }Bi^+}).V_b-(Bi^-\text{ XOR }Bi^+).(V_a+V_b)/2-(Bi^-\text{ AND }Bi^+).V_a$, and residual voltage V2 delivered by second means for calculating 6 can be defined as being equal to $4V_{in}-2(\overline{Bi^-\text{ AND }Bi^+}).V_b-2(Bi^-\text{ XOR }Bi^+).(V_a+V_b)/2-2(Bi^-\text{ AND }Bi^+).V_a-(\overline{Bi_{i+1}^-\text{ AND }Bi_{i+1}^+}).V_b-(Bi_{i+1}^-\text{ XOR }Bi_{i+1}^+).(V_a+V_b)/2-(\overline{Bi_{i+1}^+\text{ AND }\overline{B_{i+1}^+}}).V_a$. AND and XOR (exclusive or) represent the boolean operators. These equations can also be written in the same form as in the foregoing.

This particular architecture also enables the precision of the converter to be increased for the same digital resolution, i.e. for conversion on the same number of bits. By means of such a converter which integrates means for calculating on two binary signals, the degradations of the analog signal on converter output A are reduced compared with the use of two successive stages each having their own means for calculating intermediate voltages. This separation of digital encoding and of calculation of an analog residue further enables the properties of these two branches to be optimized and a residue, i.e.

a second intermediate voltage, to be delivered with better precision on output of the converter. This second intermediate voltage being used for obtaining two successive bits, this then results in the precision of the binary code resulting from conversion of voltage Vin being increased. This architecture also reduces the consumption and space occupation compared with other two-bit analog-to-digital converters (i.e. two one-bit converters connected in series), which makes it a particularly advantageous architecture.

In conventional manner, the sampling and calculating functions of the sample and hold stages and of the means for calculating can be performed in a single element which is generally achieved by assembly of switched capacitors.

In an embodiment that is not represented, it is conceivable to perform mutualisation of the means for comparing. This mutualisation can be achieved for example by switches.

In an advantageous embodiment, when the converter is in a pipeline architecture, the two successive stages are in phase opposition. Under these conditions, one of the stages performs sampling while the other stage performs the multiplication operation and vice-versa.

In an alternative embodiment that is not represented, the reference voltage can be applied on the plus terminal of comparators 2 and 5 and the voltage to be compared on the minus terminal. The result obtained being opposite, the data processing mode has to be modified, but the general operation of the converter remains unchanged.

In a more generic embodiment, the successive approximation analog-to-digital converter can comprise a plurality of approximation stages. The converter comprises an input terminal for applying the input voltage and means for setting an upper limit voltage and a lower limit voltage of a conversion range. The converter also comprises a succession of approximation stages, each approximation stage comprising an analog input terminal, an analog output terminal and a digital output terminal, the analog input of an approximation stage is connected to the analog output of the previous approximation stage.

each approximation stage comprising:

Each approximation stage comprises a voltage comparator and a calculator and each approximation stage delivers at least one digital value, for example one bit. Each approximation stage is connected to the input terminal of the converter so as receive the input voltage, to the analog output terminal of the directly previous approximation stage (i.e to the precedent approximation stage delivering the direct precedent digital value) so as to determine one digital value and to the comparators of all the previous approximation stages so as to receive the digital values enabling the analog residual voltage to be produced. In an approximation stage, the comparator is connected to the analog output terminal of the directly previous approximation stage and the calculator is connected to the input terminal of the converter, to its associated comparator and to the previous comparators. The output terminal of the converter is connected to the analog input terminal of the second approximation stage.

The invention claimed is:

1. A successive-approximation analog-to-digital converter for converting an input voltage on at least two bits comprising:

a first circuitry configured for setting an upper limit voltage and a lower limit voltage of a conversion range, the input voltage being comprised in the conversion range, an input terminal receiving the input voltage, a first comparator performing a first comparison of the input voltage with a first reference voltage and delivering a first digital bit according to the first comparison, a first calculator comprising a first analog input connected to the input terminal, second and third inputs connected to the first circuitry so as to receive the upper limit voltage and the lower limit voltage, a fourth input connected to the first comparator so as to receive the first digital bit and an output providing an intermediate analog voltage, a second comparator performing a second comparison of the intermediate analog voltage with a second reference voltage and delivering a second digital bit according to the second comparison, a second calculator comprising a first analog input connected to the input terminal, second and third inputs connected to the first circuitry so as to receive the upper limit voltage and the lower limit voltage, a fourth input connected to the first single-bit comparator so as to receive the first digital bit, a fifth input connected to the second comparator so as to receive the second digital bit and an output providing an residual analog voltage.

2. Converter according to claim 1, wherein the first comparator is a single-bit comparator delivering one bit according to a position of the input voltage with a reference voltage located at an equipotential of the lower and upper limit voltages.

3. Converter according to claim 1, wherein the second comparator is a single-bit comparator.

4. Converter according to claim 3, wherein the second calculator is configured so as to deliver the residual analog voltage according to $4Vin-(Va+Vb)+Bi.(Va-Vb)+\overline{Bi}.(Vb-Va)-(Va+Vb)/2+B_{i+1}.(Va-Vb)/2+\overline{B}_{i+1}.(Vb-Va)$ and wherein Vin is the input voltage Va is the lower limit voltage Vb is the higher limit voltage, $\overline{Bi}$ is the complementary value of the first bit, $\overline{B}_{i+1}$ is the complementary value of the second bit.

5. Converter according to claim 1, wherein the first comparator comprises two single-bit comparators configured so as to divide the conversion range into three elementary ranges, the first comparator delivers two elementary bits according to the location of the input voltage in the three elementary ranges and wherein the first calculator and the second calculator comprise an additional input connected to the first comparator, the first calculator and the second calculators receiving the first and second elementary bits.

6. Converter according to claim 1, wherein the second comparator comprises two single-bit comparators configured so as to divide the conversion range into three elementary ranges, the second comparator delivers two elementary bits according to the location of the input voltage in the three elementary ranges and wherein the second calculator comprises an additional input connected to the second comparator, the second calculators receiving the first and second elementary bits.

7. Converter according to claim 6, wherein the second calculator is configured so as to deliver the residual analog voltage according to $4Vin-2(\overline{Bi}\text{ AND }Bi^+).Vref+-2(\overline{Bi}^-\text{ OR }Bi^+).(Va+Vb)/2-2(\overline{Bi}^-\text{ AND }\overline{Bi}^+).Vref--(B_{i+1}^-\text{ AND }B_{i+1}^+).Vref+-(\overline{B}_{i+1}^-\text{ OR }B_{i+1}^+).(Va+Vb)/2-(\overline{B}_{i+1}^-\text{ AND }\overline{B}_{i+1}^+).Vref-$. and wherein Vin is the input voltage, Va is the lower limit voltage, Vb is the higher limit voltage, Vref+ is an upper reference voltage, Vref- is a lower reference voltage, $\overline{Bi}$ is the complementary value of the first bit, $\overline{B}_{i+1}$ is the complementary value of the second bit.

8. Converter according to claim 1, wherein the output of the second calculator is electrically coupled to the input terminal.

* * * * *